(12) United States Patent
Chang et al.

(10) Patent No.: US 12,156,355 B2
(45) Date of Patent: Nov. 26, 2024

(54) DISPLAY APPARATUS

(71) Applicant: ASUSTeK COMPUTER INC., Taipei (TW)

(72) Inventors: Yu-Chiao Chang, Taipei (TW); Tsung-Ju Chiang, Taipei (TW); Kai-Chieh Hsu, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 194 days.

(21) Appl. No.: 17/897,239

(22) Filed: Aug. 29, 2022

(65) Prior Publication Data

US 2023/0240030 A1 Jul. 27, 2023

(30) Foreign Application Priority Data

Jan. 26, 2022 (TW) ................. 111201077

(51) Int. Cl.
*H05K 5/02* (2006.01)
(52) U.S. Cl.
CPC ................. *H05K 5/0234* (2013.01)
(58) Field of Classification Search
CPC .. H05K 5/0234; F16M 11/10; F16M 11/2021; F16M 13/005; F16M 13/022; F16M 11/041
See application file for complete search history.

(56) References Cited

U.S. PATENT DOCUMENTS

| 8,934,237 | B2* | 1/2015 | Cheng | H05K 7/00 |
| | | | | 361/679.55 |
| 10,061,348 | B2* | 8/2018 | Shen | G06F 1/1647 |
| 10,700,728 | B2* | 6/2020 | Zaloom | H04B 1/3877 |
| 11,519,548 | B2* | 12/2022 | Hsu | F16M 11/041 |
| 11,603,960 | B1* | 3/2023 | Wen | F16M 13/022 |
| 2022/0003355 | A1 | 1/2022 | Hsu | |

FOREIGN PATENT DOCUMENTS

| CN | 2737124 | 10/2005 |
| TW | I291605 | 12/2007 |
| TW | 201027995 | 7/2010 |
| TW | M446467 | 2/2013 |
| TW | I732616 | 7/2021 |

* cited by examiner

*Primary Examiner* — Anthony Q Edwards
*Assistant Examiner* — Hung Q Dang
(74) *Attorney, Agent, or Firm* — JCIPRNET

(57) ABSTRACT

A display apparatus adapted for connecting with a supporting stand is provided. The supporting stand includes a clamping portion. The display apparatus includes a main body. The main body includes a back surface. The back surface includes a connecting hole. A fixing component is in the connecting hole. The clamping portion is adapted to reach into the connecting hole. When the clamping portion reaches into the connecting hole, the clamping portion is arranged around and abuts against the fixing component, so that the display apparatus is connected to the supporting stand.

8 Claims, 8 Drawing Sheets

DISPLAY APPARATUS

CROSS-REFERENCE TO RELATED APPLICATION

This application claims the priority benefit of Taiwan application serial no. 111201077, filed on Jan. 26, 2022. The entirety of the above-mentioned patent application is hereby incorporated by reference herein and made a part of this specification.

BACKGROUND

Technical Field

The disclosure relates to an electronic apparatus, and in particular, relates to a display apparatus.

Description of Related Art

Generally, mounting holes (VESA standard mounting holes) are provided on the back of a display apparatus, so that the display apparatus is conveniently locked to the bonding plate (VESA plate) on the supporting stand. However, this type of locking cannot be performed quickly and conveniently. When installing, repairing, or adjusting the display apparatus, the user needs to fix the display apparatus to the supporting stand or disassemble the display apparatus from the supporting stand, which is time-consuming and requires a lot of labor.

SUMMARY

The disclosure provides a display apparatus adapted for connecting with a supporting stand. The supporting stand includes a clamping portion. The display apparatus includes a main body. The main body includes a back surface. The back surface includes a connecting hole. A fixing component is in the connecting hole. The clamping portion is adapted to reach into the connecting hole. When the clamping portion reaches into the connecting hole, the clamping portion is arranged around and abuts against the fixing component, so that the display apparatus is connected to the supporting stand.

To sum up, in the display apparatus provided by the disclosure, through the structural design of the connecting hole of the main body and the fixing component in the connecting hole, the supporting stand is directly arranged around and abuts against the fixing component through the clamping portion to be connected to the display apparatus. The display apparatus and the supporting stand thus is easily assembled together and disassembled from each other, and such an operation is easily performed.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
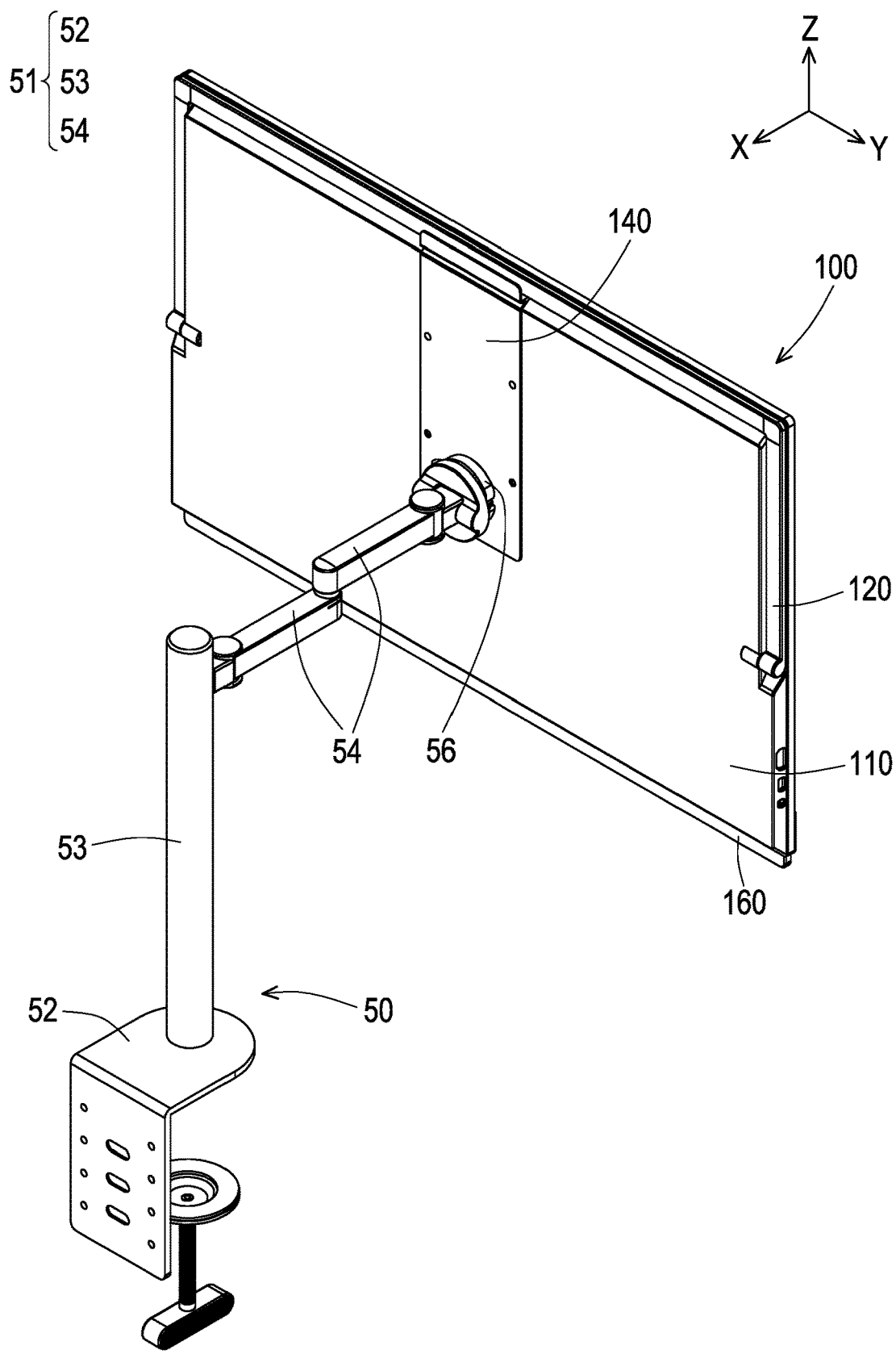
FIG. 1 is a three-dimensional view of a display apparatus connected to a supporting stand according to an embodiment of the disclosure.
Figure 3:
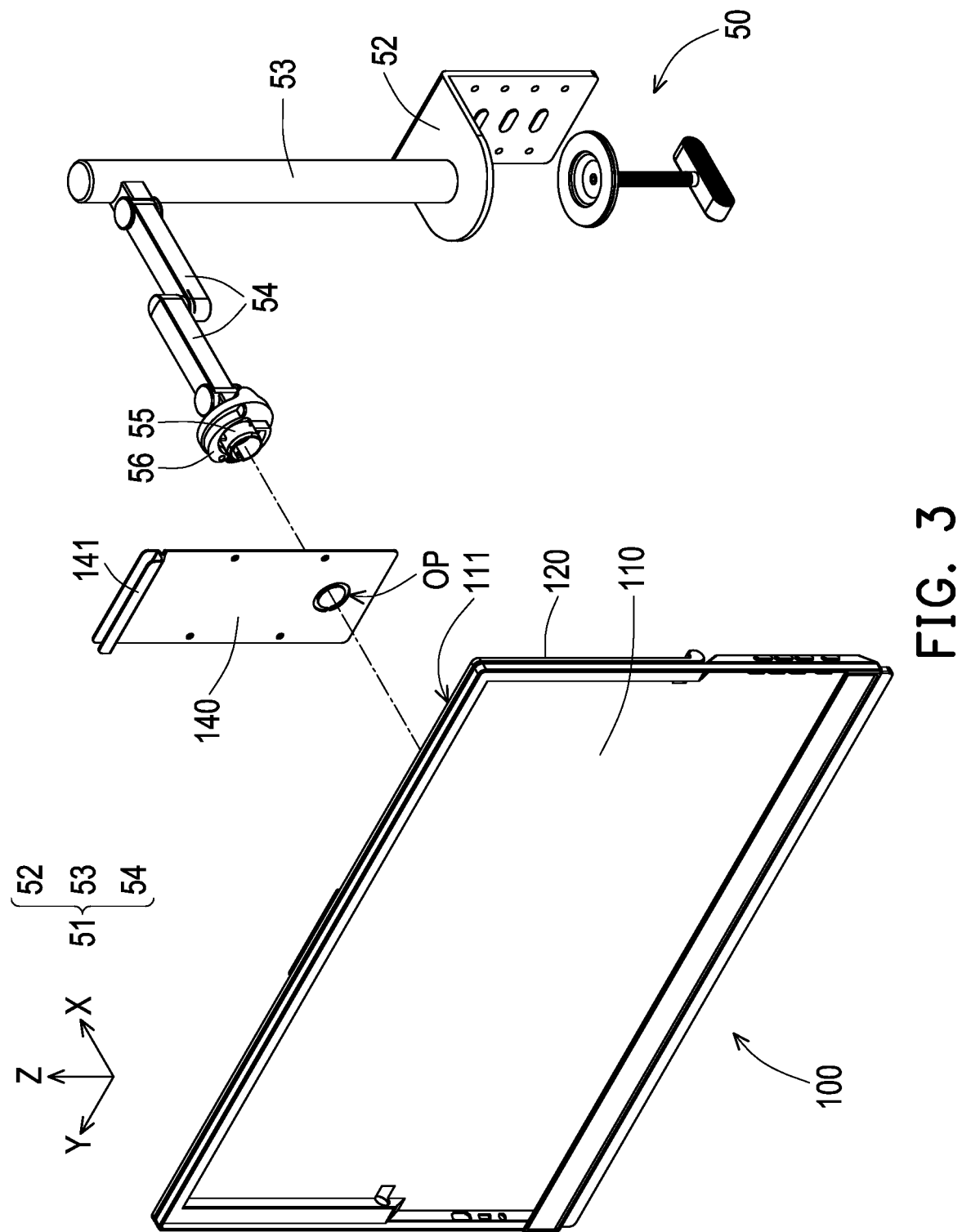
FIG. 3 is an exploded view of some parts of the display apparatus and the supporting stand of FIG. 2 from another viewing angle.

With reference to FIG. 1 and FIG. 3 first, the disclosure provides a display apparatus 100 adapted for connecting with a supporting stand 50, and the supporting stand 50 includes a clamping portion 55.

In an embodiment, the supporting stand 50 includes a supporting body 51 connected to the clamping portion 55. The supporting body 51 includes, for example, a bottom base 52, an upright column 53, and two pivot columns 54 pivotally connected to each other along a Z axis. The bottom base 52 is fixed on a work surface such as a desktop, and the upright column 53 is erected on the bottom base 52 along the Z axis. One of the pivot columns 54 is slidably disposed on the upright column 53, and the other pivot column 54 is connected to the clamping portion 55, but it is not limited thereto.

Figure 2:
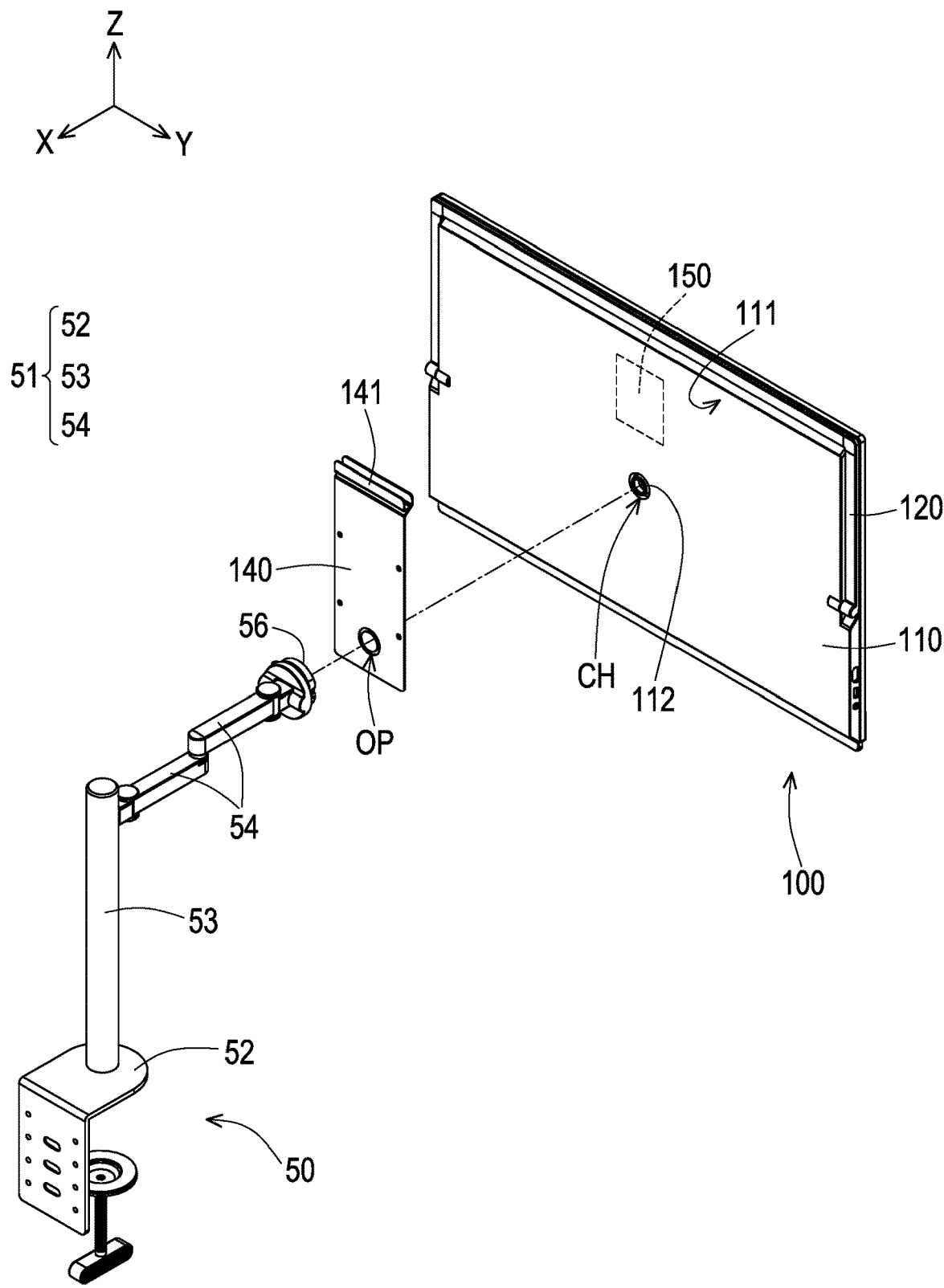
FIG. 2 is an exploded view of some parts of the display apparatus and the supporting stand of FIG. 1.
Figure 4:
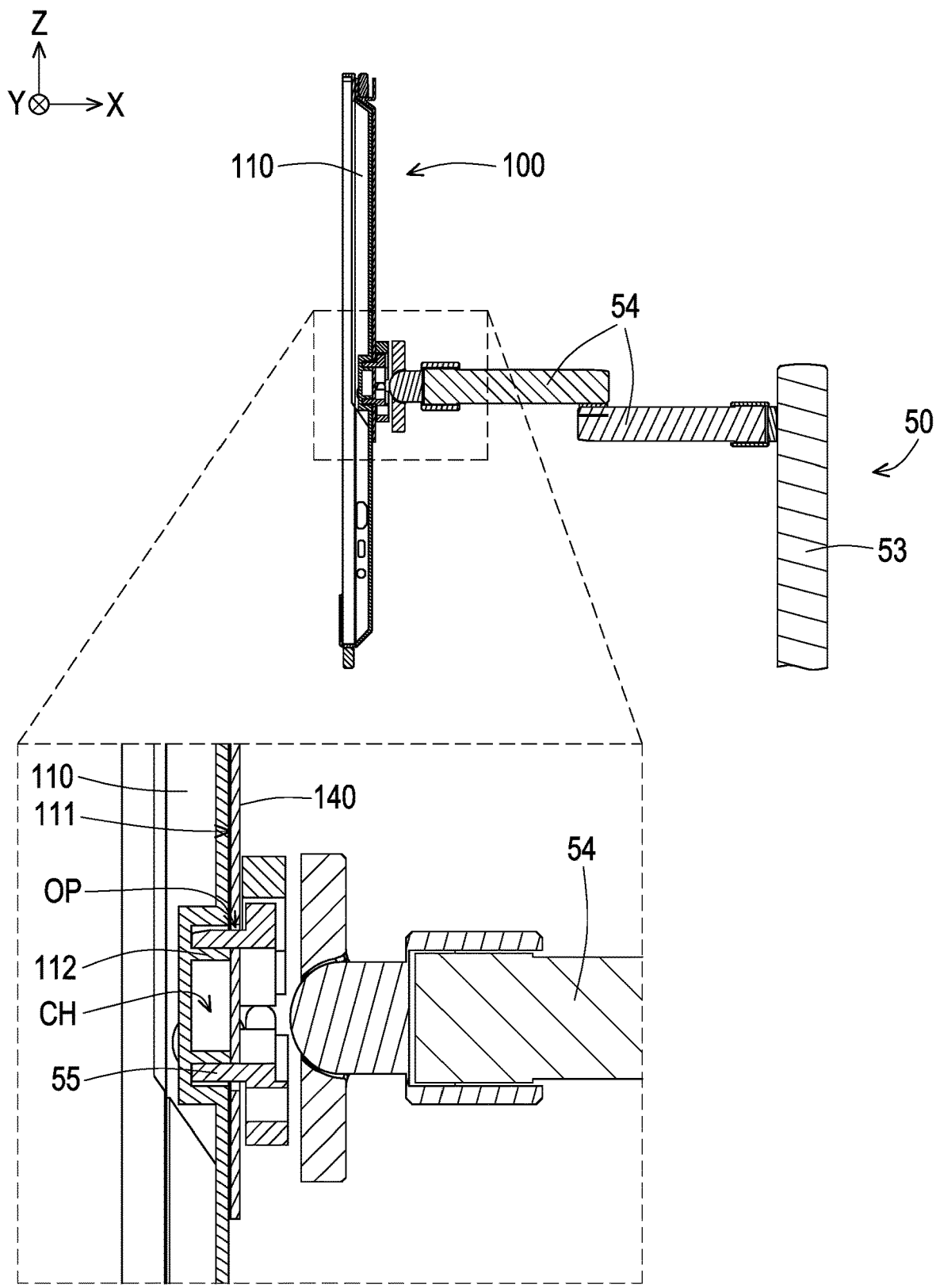
FIG. 4 is a partial central cross-sectional view of the display apparatus and the supporting stand of FIG. 1.

With reference to FIG. 2 to FIG. 4 together, in this embodiment, the display apparatus further includes a main body 110, and the supporting stand 50 further includes a fastening portion 56. The main body 110 includes a back surface 111. The back surface 111 of the main body 110 includes a connecting hole CH, and the connecting hole CH includes a fixing component 112. The clamping portion 55 is adapted to reach into the connecting hole CH in an X-axis direction, and the clamping portion 55 of the supporting stand 50 is detachably arranged around the fixing component 112. The fastening portion 56 is connected to the clamping portion 55, and the fastening portion 56 is adapted for pressing the clamping portion 55 to make the clamping portion 55 abut against the fixing component 112.

When the clamping portion 55 of the supporting stand 50 reaches into the connecting hole CH in the X-axis direction as shown in FIG. 4, the clamping portion 55 is arranged around the fixing component 112. Herein, a user operates the fastening portion 56 to force the fastening portion 56 to press against the clamping portion 55, so that the clamping portion 55 abuts against the fixing component 112. In other words, the clamping portion 55 of the supporting stand 50 is connected to the display apparatus 100 through the fixing component 112 in the connecting hole CH.

Figure 5:
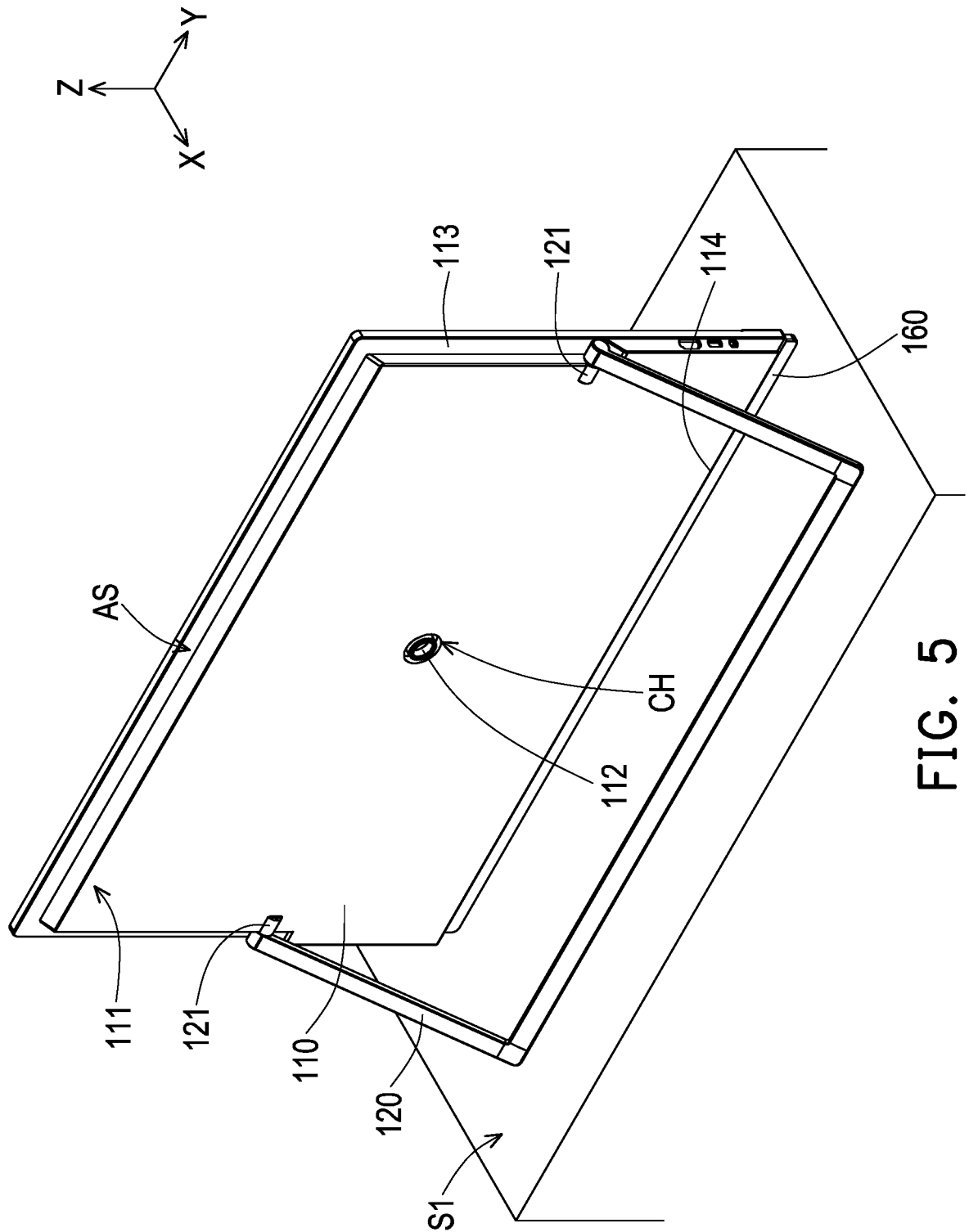
FIG. 5 is a three-dimensional view of a stand of the display apparatus of FIG. 1 pivoted relative to a main body.

With reference to FIG. 1 and FIG. 5 together, in this embodiment, the display apparatus 100 further includes a stand 120. A peripheral edge 113 of the back surface 111 of the main body 110 includes an accommodating groove AS corresponding to the stand 120, and the stand 120 is selectively located in the accommodating groove AS. The stand 120 is pivotally connected to the back surface 111 of the main body 110 along a Y axis through a pivot structure 121, and the stand 120 is pivoted relative to the main body 110 along the Y axis and selectively supports the main body 110 on a plane S1.

In this way, the display apparatus 100 is not only connected to the supporting stand 50 through the connecting hole CH of the main body 110 and the arrangement of the fixing component 112, but also supports the main body 110 on the plane S1 through the stand 120, and the display apparatus 100 thereby has improved operation flexibility.

In an embodiment, since the stand 120 supports the main body 110 on the plane S1, when the user intends to connect the display apparatus 100 to the supporting stand 50 along the X axis, the stand 120 is pivoted relative to the main body 110 along the Y axis first to make the main body 110 stand upright on the plane S1. Herein, the user connects the supporting stand 50 to the display apparatus 100 without supporting the weight of the main body 110, so that the user operates intuitively and easily.

Figure 6:
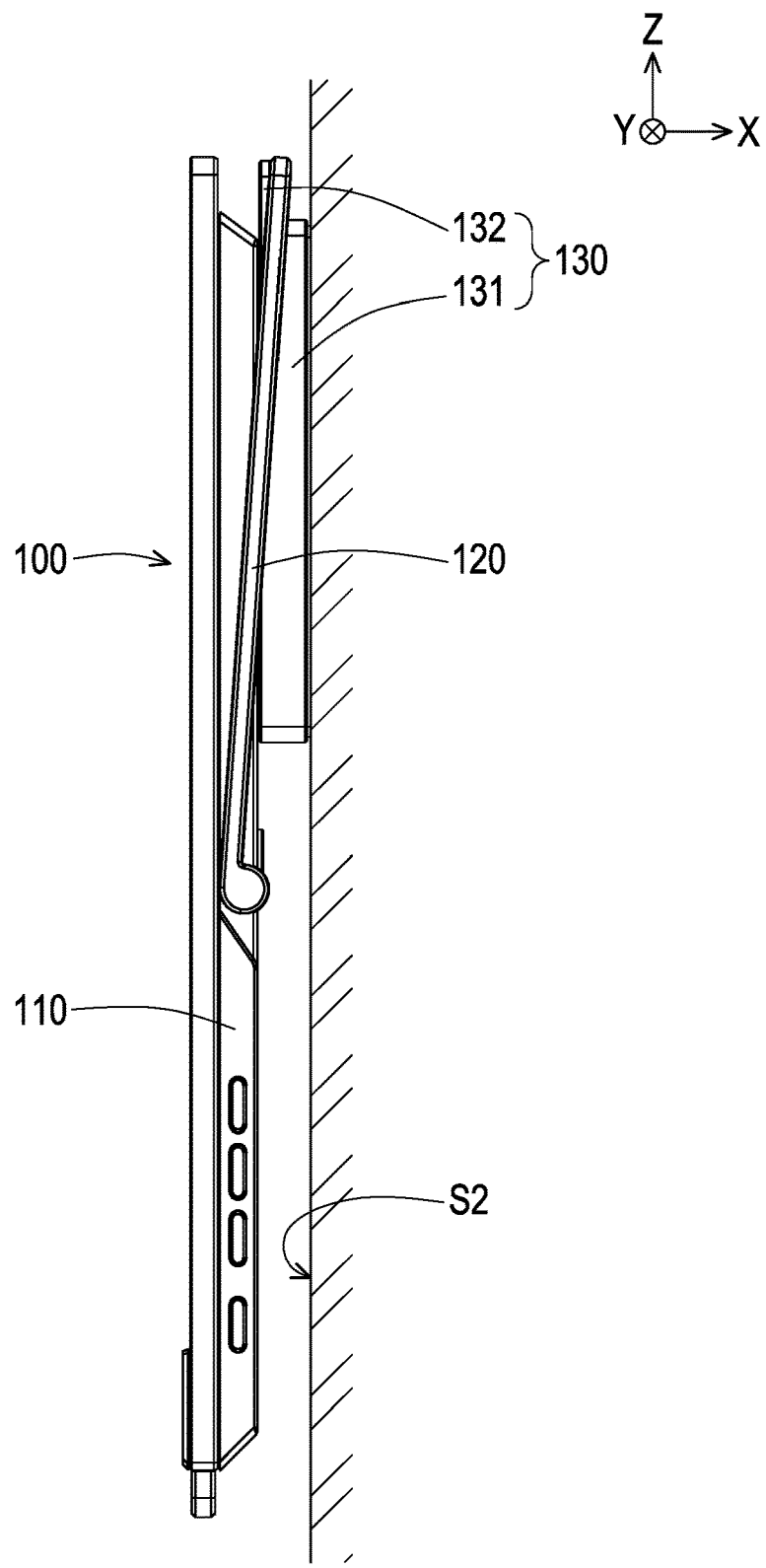
FIG. 6 is a three-dimensional view of the stand of the display apparatus of FIG. 1 pivoted relative to the main body and hung to a fixing component.

With reference to FIG. 6, in this embodiment, the display apparatus 100 corresponds to the fixing component 130 through the stand 120, so that the display apparatus 100 is adapted for being combined with the fixing component 130. To be specific, the fixing component 130 is fixed on a wall surface S2 and includes a fixing main body portion 131 and a fixing protruding portion 132. The fixing main body portion 131 is located between the wall surface S2 and the fixing protruding portion 132.

When the stand 120 is pivoted relative to the main body 110 along the Y axis as shown in FIG. 6, the stand 120 is hung to the fixing main body portion 131 along the Z axis and abuts against the fixing protruding portion 132, so that the stand 120 is located between the wall surface S2 and the fixing protruding portion 132 and thus is connected to the fixing component 130.

In this way, the display apparatus 100 is not only connected to with the supporting stand 50 through the connecting hole CH of the main body 110 and the arrangement of the fixing component 112, but also allows the main body 110 of the display apparatus 100 to be hung to the fixing component 130 fixedly connected to the wall surface S2 to be connected to the fixing component 130 through the stand 120, and the display apparatus 100 thereby has improved operation flexibility.

With reference to FIG. 2 to FIG. 4, in this embodiment, the display apparatus 100 further includes an adapter 140. The adapter 140 includes a protruding portion 141. The adapter 140 is selectively connected to the back surface 111 of the main body 110. The protruding portion 141 protrudes from the back surface 111 of the main body 110 and is located above the connecting hole CH of the main body 110 on the Z axis.

In an embodiment, the adapter 140 is a metal component, but it is not limited thereto. With reference to FIG. 2, in an embodiment, a magnetic component 150 is disposed on the back surface 111 of the main body 110, and the magnetic component 150 attracts the adapter 140, so as to allow the adapter 140 to be connected to the back surface 111 of the main body 110, but it is not limited thereto.

Figure 7:
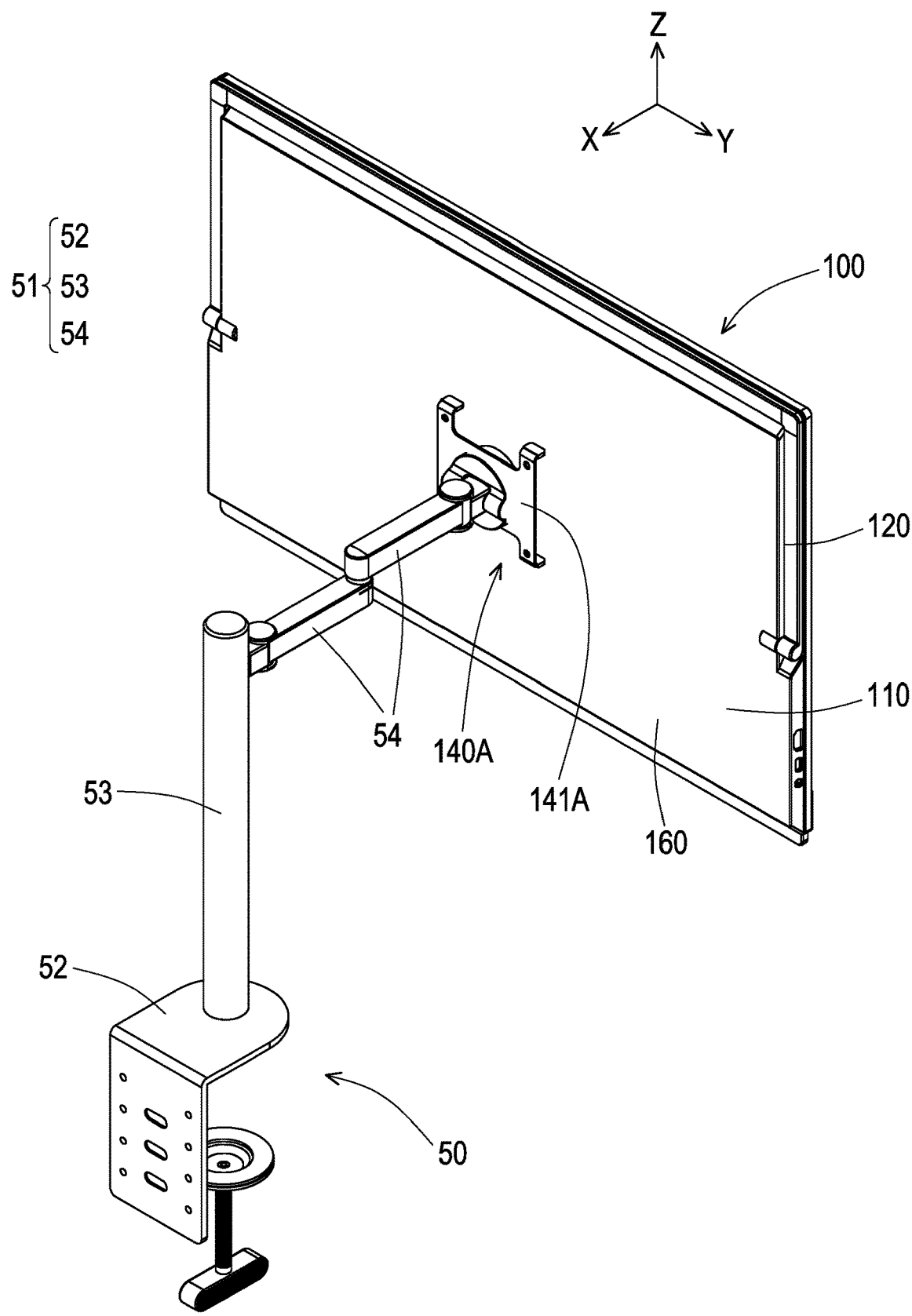
FIG. 7 is a three-dimensional view of a display apparatus connected to a supporting stand according to another embodiment of the disclosure.

With reference to FIG. 7, in other embodiments, an adapter 140A is located between the pivot columns 54 and the clamping portion 55 of the supporting stand 50. Further, a protruding portion 141A of the adapter 140A is provided with a mounting hole (VESA standard mounting hole), so that the main body 110 is locked to another bonding plate (VESA plate) in other use states.

With reference to FIG. 2 to FIG. 4, in this embodiment, the adapter 140 includes an opening OP, and the opening OP of the adapter 140 corresponds to the connecting hole CH of the main body 110. When the adapter 140 is connected to the back surface 111 of the main body 110, the connecting hole CH of the main body 110 is exposed to the opening OP of the adapter 140, so that the clamping portion 55 of the supporting stand 50 penetrates the opening OP of the adapter 140 as shown in FIG. 4 and reaches into the connecting hole CH of the main body 110. In an embodiment, since the protruding portion 141 of the adapter 140 protrudes from the back surface 111 of the main body 110 and corresponds to the connecting hole CH of the main body 110, when the user intends to connect the display apparatus 100 to the supporting stand 50 (FIG. 1), the position of the connecting hole CH of the main body 110 is identified through the protruding portion 141. As such, the display apparatus 100 is connected to the supporting stand 50 on any side relative to the back surface 111 of the main body 110, and the user thus operates intuitively and easily.

With reference to FIG. 5, in this embodiment, the display apparatus 100 further includes an auxiliary component 160. The auxiliary component 160 is disposed on a side edge 114 of the main body 110. When the display apparatus 100 supports the main body 110 on the plane S1 through the stand 120 as shown in FIG. 5, the auxiliary component 160 is located between the plane S1 and the side edge 114 of the main body 110. In this way, the user adjusts the height of the main body 110 relative to the plane S1 in the Z-axis direction through the auxiliary component 160, and the user is thereby provided with an improved viewing experience of the display apparatus 100.

In an embodiment, a material of the auxiliary component 160 is an anti-wear material, but it is not limited thereto. In an embodiment, the auxiliary component 160 is a transparent elevating component, but it is not limited thereto. In an embodiment, the auxiliary component 160 is a U-shaped handle structure (not shown), and in addition to the function of elevating the main body 110, the auxiliary component 160 is also be used as a handle for holding the display apparatus 100, which is not limited thereto.

Figure 8:
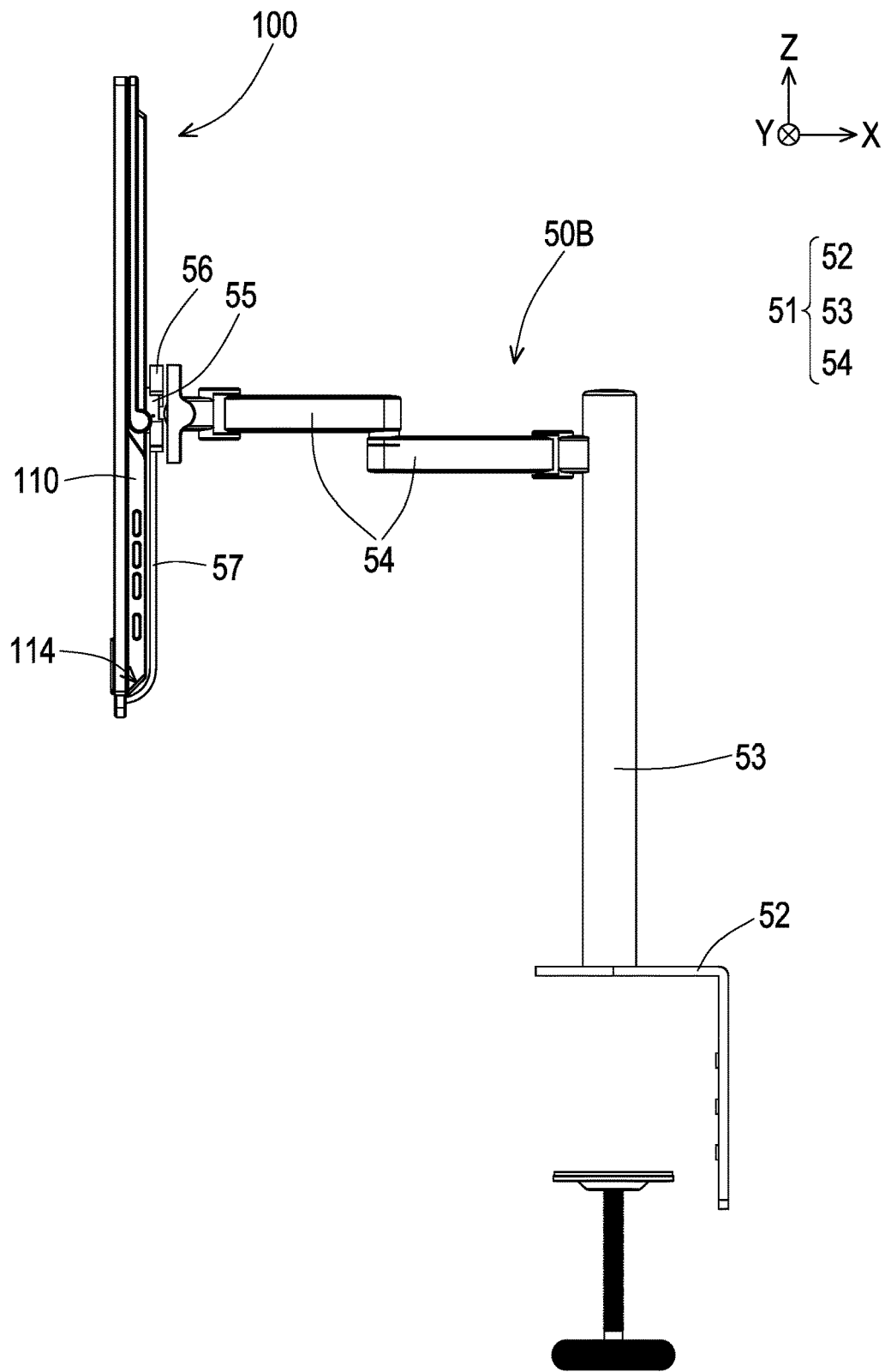
FIG. 8 is a three-dimensional view of a display apparatus connected to a supporting stand according to another embodiment of the disclosure.

FIG. 8 is a three-dimensional view of a display apparatus connected to a supporting stand according to another embodiment of the disclosure. With reference to FIG. 1 and FIG. 8 together, a supporting stand 50B provided by this embodiment is similar to the supporting stand 50 shown in FIG. 1, and the difference therebetween is that the supporting stand 50B further includes a supporting portion 57.

With reference to FIG. 8, in this embodiment, the supporting stand 50B includes the supporting portion 57. The supporting portion 57 first extends from the clamping portion 55 along the Z axis and then extends along the X axis in a direction relative to the pivot columns 54. In this way, the side edge 114 of the main body 110 leans against the supporting portion 57 of the supporting stand 50B, and the main body 110 is prevented from shaking relative to the supporting stand 50B, so that the display apparatus 100 is stably connected to the supporting stand 50B.

In view of the foregoing, in the display apparatus provided by the disclosure, through the structural design of the connecting hole of the main body and the fixing component in the connecting hole, the supporting stand is directly arranged around and abuts against the fixing component through the clamping portion to be connected to the display apparatus. The display apparatus and the supporting stand are thus easily assembled together and disassembled from each other, and such an operation is easily performed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, adapted for connecting with a supporting stand, wherein the supporting stand comprises a clamping portion and a fastening portion, the fastening portion is connected to the clamping portion, and the display apparatus comprises:
   a main body, having a back surface, wherein the back surface comprises a connecting hole, the connecting hole comprises a fixing component, the clamping portion is adapted for reaching into the connecting hole, and the fastening portion is connected to the clamping portion, the fastening portion is adapted for pressing the clamping portion to make the clamping portion abut against the fixing component,
   wherein, when the clamping portion reaches into the connecting hole, the clamping portion is arranged around and abuts against the fixing component, so that the display apparatus is connected to the supporting stand.

2. The display apparatus according to claim 1, further comprising a stand, wherein the stand is pivotally connected to the back surface through a pivot structure.

3. The display apparatus according to claim 2, adapted for connecting with a fixing component, wherein the display apparatus corresponds to the fixing component through the stand.

4. The display apparatus according to claim 2, wherein the back surface comprises an accommodating groove, and the stand is selectively located in the accommodating groove.

5. The display apparatus according to claim 1, adapted for being matched with an adapter, wherein the adapter comprises a protruding portion, the adapter is selectively connected to with the back surface, and the protruding portion protrudes from the back surface.

6. The display apparatus according to claim 5, wherein the back surface comprises a magnetic component, and the magnetic component attracts the adapter.

7. The display apparatus according to claim 1, further comprising an auxiliary component, wherein the auxiliary component is disposed on one side of the main body.

8. The display apparatus according to claim 7, wherein a material of the auxiliary component is an anti-wear material.

* * * * *